United States Patent
Yang et al.

(10) Patent No.: US 7,687,333 B2
(45) Date of Patent: Mar. 30, 2010

(54) METHOD OF FABRICATING THIN FILM TRANSISTOR AND ARRAY SUBSTRATE FOR LIQUID CRYSTAL DISPLAY DEVICE INCLUDING THE SAME

(75) Inventors: Hee-Jung Yang, Namnyangju-si (KR); Dong-sun Kim, Gnyangfu-si (KR); Du-Seok Oh, Daejeon (KR); Won-Joon Ho, Cheongfu-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/965,423

(22) Filed: Dec. 27, 2007

(65) Prior Publication Data

US 2008/0227243 A1 Sep. 18, 2008

(30) Foreign Application Priority Data

Mar. 14, 2007 (KR) ...................... 10-2007-0025215

(51) Int. Cl.
*H01L 21/336* (2006.01)
(52) U.S. Cl. ............................... 438/158; 257/E21.411
(58) Field of Classification Search ................... 438/30, 438/149, 942, 158; 257/E21.411

See application file for complete search history.

(56) References Cited

U.S. PATENT DOCUMENTS

| | | | |
|---|---|---|---|
| 7,352,004 B2 * | 4/2008 | Lee et al. | 257/59 |
| 2007/0013078 A1 * | 1/2007 | Lee et al. | 257/762 |
| 2008/0182352 A1 * | 7/2008 | Cho et al. | 438/30 |

FOREIGN PATENT DOCUMENTS

KR 1020050023625 A 3/2005

OTHER PUBLICATIONS

Yue et al., Copper nitride thin film prepared by reactive radio-frequency magnetron sputtering, Journal of Applied Physics 98, 103506 (2005), pp. 1-7.

* cited by examiner

*Primary Examiner*—W. David Coleman
*Assistant Examiner*—Daniel Shook
(74) *Attorney, Agent, or Firm*—Birch, Stewart, Kolasch & Birch LLP

(57) ABSTRACT

According to an embodiment, a method of fabricating a thin film transistor comprises forming a gate electrode on a substrate; forming a gate insulating layer on the gate electrode; forming a semiconductor layer on the gate insulating layer, the semiconductor layer corresponding to the gate electrode; forming first and second barrier patterns on the semiconductor layer, the first and second barrier patterns including copper nitride; and forming source and drain electrodes on the first and second barrier patterns, respectively, the source and drain electrodes including pure copper.

14 Claims, 10 Drawing Sheets

METHOD OF FABRICATING THIN FILM TRANSISTOR AND ARRAY SUBSTRATE FOR LIQUID CRYSTAL DISPLAY DEVICE INCLUDING THE SAME

The present application claims the priority benefit of Korean Patent Application No. 10-2007-0025215 filed in Korea on Mar. 14, 2007, which is hereby incorporated by reference.

BACKGROUND OF THE INVENTION

1. Field of the Invention

The present invention relates to a liquid crystal display (LCD) device and more particularly to a method of fabricating a thin film transistor (TFT) and an array substrate for an LCD device including the TFT.

2. Discussion of the Related Art

As communication technology has developed, a need for compact display devices has developed. Plat panel display devices, such as an LCD device, a plasma display panel (PDP), a vacuum fluorescent display (VFD) device and an organic electroluminescent display (OELD) device, have been developed.

Among these display devices, since the LCD device has a smaller size, lower power consumption than a display device using cathode-ray tubes (CRT), the display device using CRT is replaced by the LCD device. Also, LCD devices are widely used for notebook computers, monitors, TV, and so on, because of their high contrast ratio and characteristics adequate to display moving images.

The LCD device uses optical anisotropy and polarization properties of liquid crystal molecules to display images. The LCD device includes an array substrate including a thin film transistor (TFT) as a switching element and a pixel electrode, a color filter substrate including a color filter layer and a common electrode, and a liquid crystal layer having the liquid crystal molecules. The liquid crystal layer is interposed between the array substrate and the color filter substrate so as to be driven by a vertical electric field induced between the pixel and common electrodes.

Referring to FIGS. 1 and 2, the array substrate is explained.

FIG. 1 is a schematic plan view of an array substrate for an LCD device according to the related art, and FIG. 2 is a cross-sectional view taken along the line II-II in FIG. 1.

In FIG. 1, a gate line 20, a gate electrode 25, an active layer 40, a source electrode 32 and a drain electrode 34, a data line 30, and a pixel electrode 70 are formed on a substrate 10 having a pixel region P. The gate and data lines 20 and 30 cross each other to define the pixel region P. The gate electrode 25 is connected to the gate line 20, and the active layer 40 is formed over the gate electrode 25. The source electrode 32 is connected to the data line 30 and spaced apart from the drain electrode 34. The gate electrode 25, the active layer 40, an ohmic contact layer (not shown), the source electrode 32 and the drain electrode 34 constitute a thin film transistor (TFT) T. Moreover, the pixel electrode 50 is formed in the pixel region "P" to be connected to the drain electrode 34 through a drain contact hole H1. Although not shown, a barrier metal pattern is formed on the ohmic contact layer (not shown) and under the source and drain electrodes 32 and 34.

A method of fabricating an array substrate is explained with FIG. 2. In FIG. 2, the gate electrode 25 is formed on the substrate 10 by depositing and patterning a first metal layer (not shown). At the same time, the gate line 20 (of FIG. 1) is formed from the first metal layer (not shown). Next, an inorganic insulating material, such as silicon nitride (SiNx) and silicon oxide (SiO2), is deposited on an entire surface of the substrate 10 including the gate electrode 25 and the gate line 20 (of FIG. 1) to form a gate insulating layer 45.

Next, the active layer 40 and the impurity-doped amorphous silicon layer (not shown) are sequentially formed on the gate insulating layer 45. The active layer 40 and the impurity-doped amorphous silicon layer (not shown) overlap the gate electrode 25. The active layer 40 and the impurity-doped amorphous silicon layer (not shown) may be formed by a plasma enhanced chemical vapor deposition (PECVD). The active layer 40 is formed of intrinsic amorphous silicon, while the impurity-doped amorphous silicon layer (not shown) is formed of impurity-doped amorphous silicon. The ohmic contact layer 41

Next, a barrier metal layer (not shown) and a second metal layer (not shown) are sequentially formed on the ohmic contact layer 41. The barrier metal layer (not shown) is formed of one of titanium (Ti), molybdenum (Mo) and molybdenum-titanium (MoTi) alloy, and the second metal layer (not shown) is formed of copper (Cu). The second metal layer (not shown) is sequentially patterned to form the source and drain electrodes 32 and 34. At the same time, the data line 30 (of FIG. 1) is formed. Next, the barrier metal layer (not shown) and the impurity-doped amorphous silicon layer (not shown) are patterned using the source and drain electrodes 32 and 34 to form a barrier metal pattern 35 and the ohmic contact layer 41. A portion of the active layer 40 is exposed between the ohmic contact layer 41. The exposed portion of the active layer 40 is defined as a channel region. The gate electrode 25, the active layer 40, the ohmic contact layer 41, the source electrode 32 and the drain electrode 34 constitute the thin film transistor (TFT) T.

Next, an inorganic insulating material, such as silicon nitride (SiNx) and silicon oxide (SiO2), is deposited to form a passivation layer 55 is foiled on the source and drain electrodes 32 and 34. And then, the passivation layer 55 is patterned to form the drain contact hole H1 exposing a portion of the drain electrode 34.

Next, a pixel electrode 70 of a transparent conductive material is formed on the passivation layer 55 and in the pixel region P. The pixel electrode 70 is connected to the drain electrode 34 through the drain contact hole H1.

In the above-mentioned array substrate, the barrier metal pattern 35 is formed of one of Ti, Mo and MoTi alloy to prevent a Cu material in the source and drain electrodes 32 and 34 being diffused. Since the source and drain electrodes 32 and 34 and the barrier metal pattern 35 are formed of different material, two deposition processes are required. Moreover, since different type etchants should be used, fabricating process becomes complicated.

Furthermore, when a wet-etching process or a photolithography process is performed onto the metal layers, which are formed of dis-similar or different kinds metallic materials, respectively, a problem, such as galvanic corrosion, is caused.

In addition, when a MoTi alloy target is used in a sputtering device, a deposition layer includes a relatively high impurity concentration. Accordingly, the deposition layer has a low adhesive strength to lower or/and upper layers.

SUMMARY OF THE INVENTION

Accordingly, the present invention is directed to a method of a thin film transistor and an array substrate for an LCD device including the same that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a method of fabricating a thin film transistor comprises forming a gate electrode on a substrate; forming a gate insulating layer on the gate electrode; forming a semiconductor layer on the gate insulating layer, the semiconductor layer corresponding to the gate electrode; forming first and second barrier patterns on the semiconductor layer, the first and second barrier patterns including copper nitride; and forming source and drain electrodes on the first and second barrier patterns, respectively, the source and drain electrodes including pure copper.

In another aspect of the present invention, a method of fabricating an array substrate for a liquid crystal display device comprises forming a gate electrode and a gate line on a substrate, the gate electrode connected to the gate line; forming a gate insulating layer on the gate electrode and the gate line; forming a semiconductor layer on the gate insulating layer, the semiconductor layer corresponding to the gate electrode; forming first and second barrier patterns on the semiconductor layer, the first and second barrier patterns including copper nitride; forming a data line and source electrode and drain electrodes, the data line crossing the gate line and connected to the source electrode, the source and drain electrodes on the first and second barrier patterns, respectively, and including pure copper; and forming a pixel electrode connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

FIGS. 3A to 3G are cross-sectional views showing fabricating processes of a portion of an array substrate for an LCD device including a TFT according to the present invention. In a substrate 110, a pixel region P including a switching region S is defined.

Figure 3A:
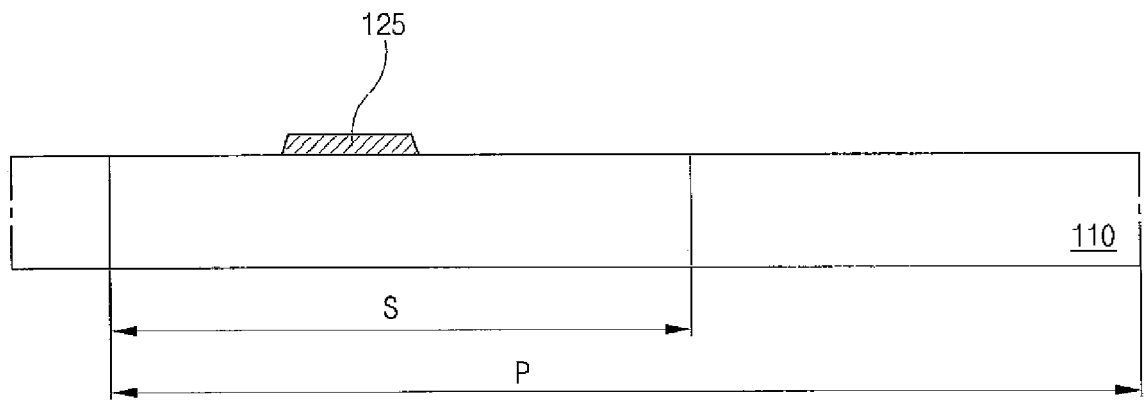
FIGS. 3A to 3G are cross-sectional views showing fabricating processes of a portion of an array substrate for an LCD device including a TFT according to the present invention.

In FIG. 3A, a first metal layer (not shown) is formed on the substrate 110 and then patterned through a first mask process to form a gate electrode 125 in the switching region S. At the same time, a gate line (not shown), which is connected to the gate electrode 125, is formed on the substrate 110.

Figure 1:
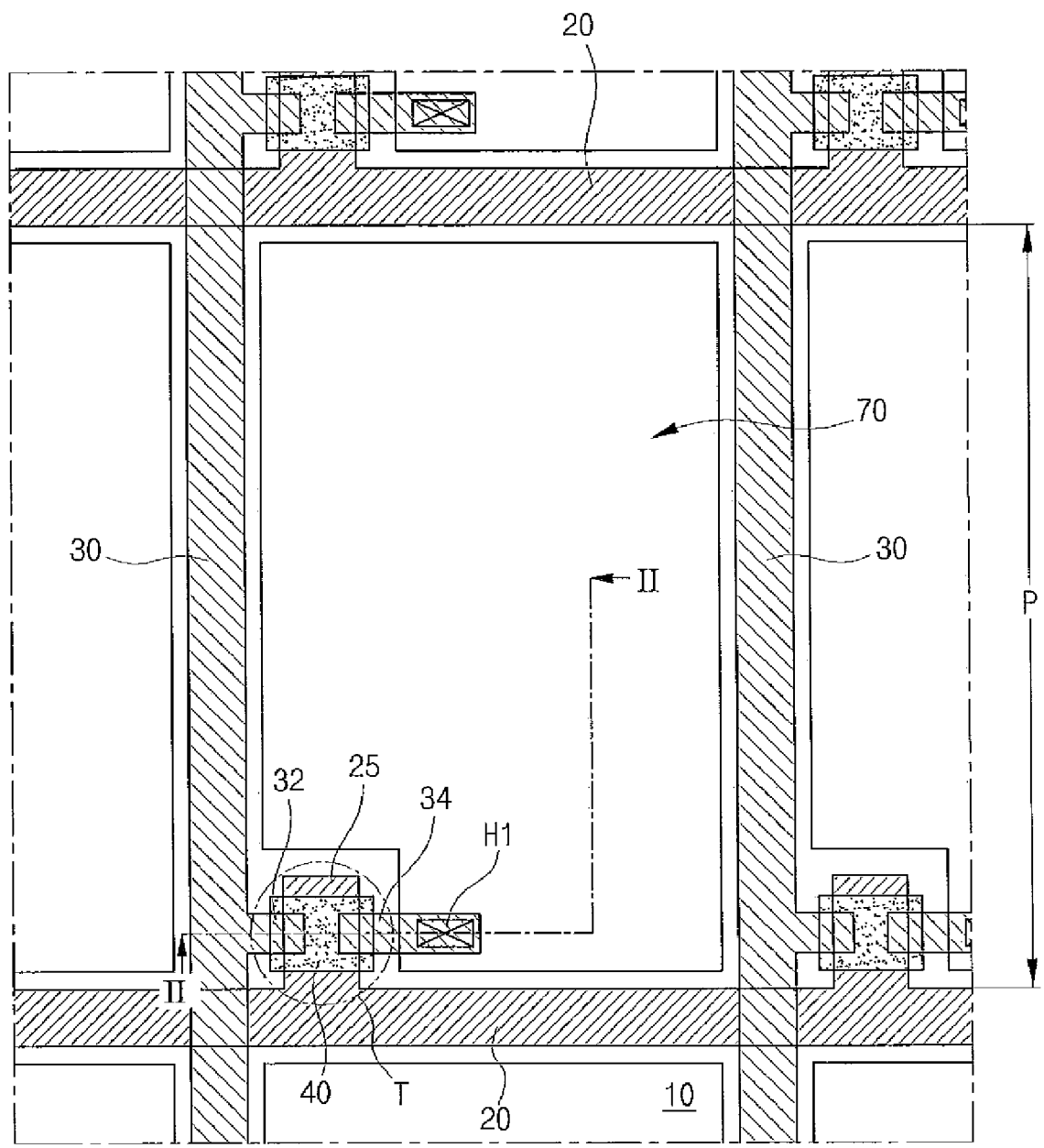
FIG. 1 is a schematic plan view of an array substrate for an LCD device according to the related art.
Figure 2:
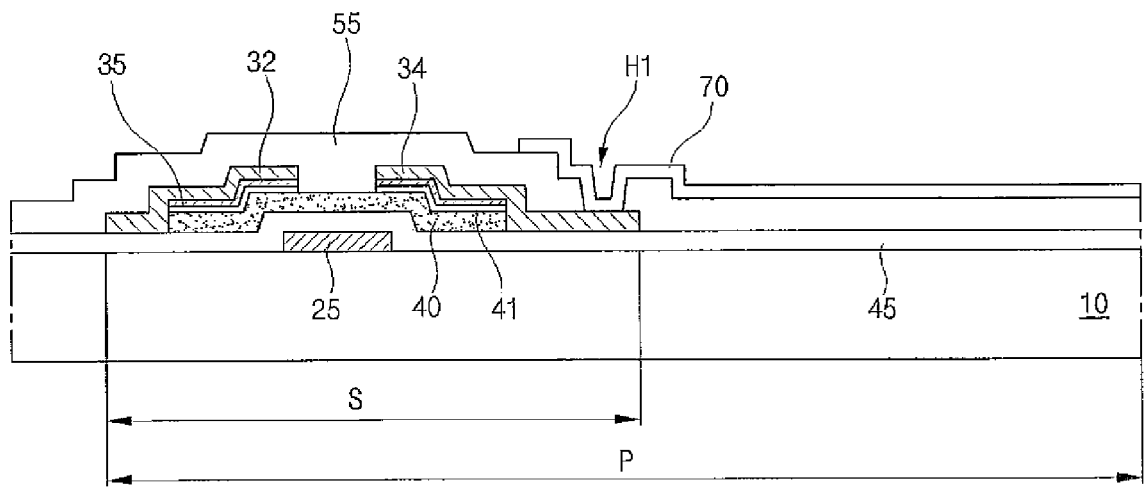
FIG. 2 is a cross-sectional view taken along the line II-II in FIG. 1.
Figure 3B:
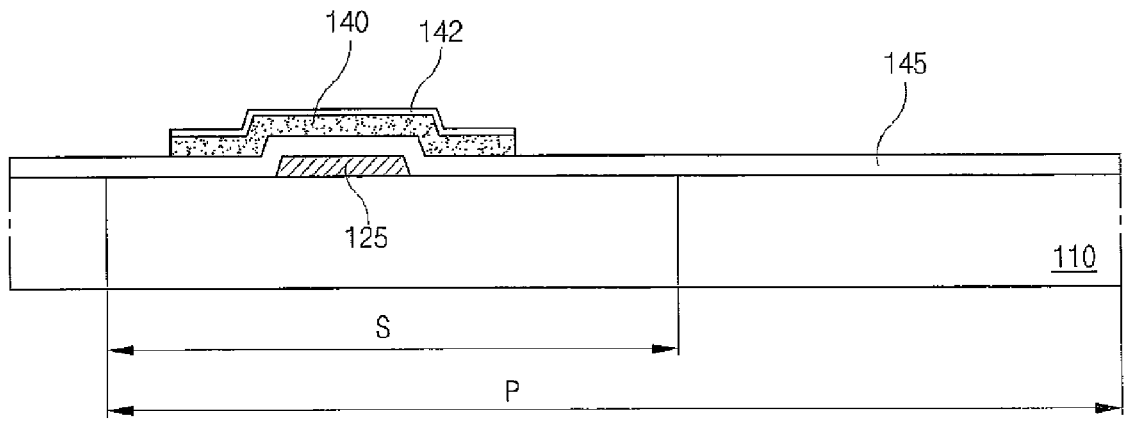

Next, in FIG. 3B, an inorganic insulating material, such as silicon nitride (SiNx) and silicon oxide (SiO2), is deposited on an entire surface of the substrate 110 including the gate electrode 25 and the gate line 20 (of FIG. 1) to form a gate insulating layer 145. Next, an intrinsic amorphous silicon layer (not shown) and an impurity-doped amorphous silicon layer (not shown) are sequentially formed the gate insulating layer 145. The intrinsic amorphous silicon layer (not shown) and the impurity-doped amorphous silicon layer (not shown) may be deposited by a chemical vapor deposition (CVD) method. And then, the intrinsic amorphous silicon layer (not shown) and the impurity-doped amorphous silicon layer (not shown) are patterned through a second mask process to form an active layer 140 and an impurity-doped amorphous silicon pattern 142. The active layer 140 and the impurity-doped amorphous silicon pattern 142 correspond to the gate electrode 125. Namely, they are disposed ill the switching region S.

Figure 3C:
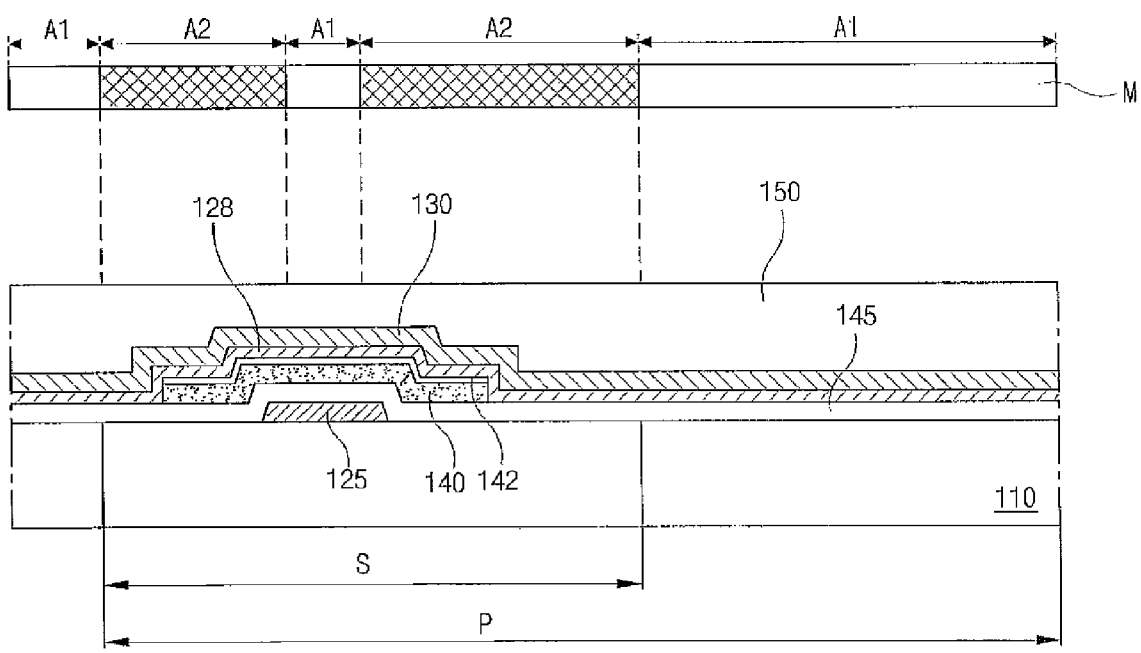
Figure 3D:
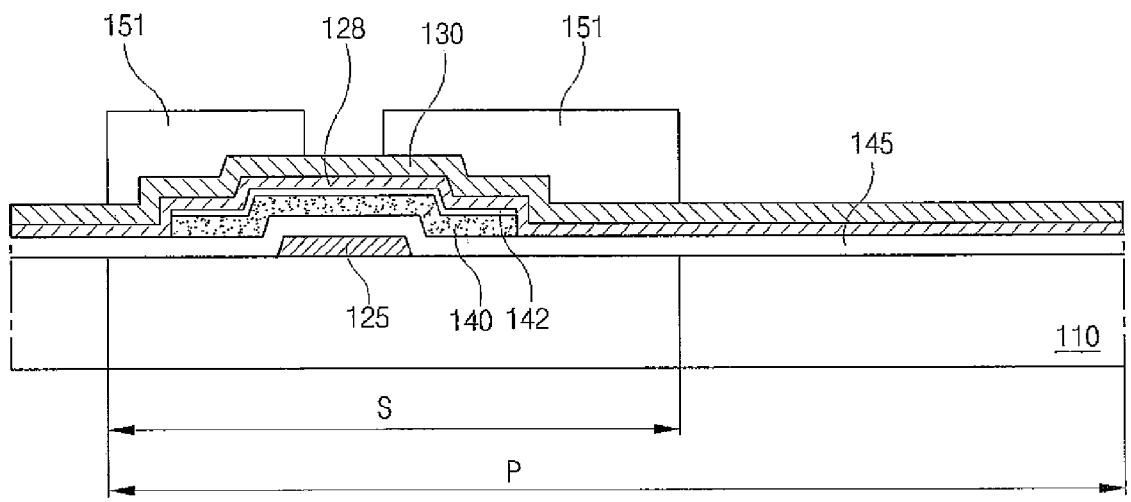
Figure 3E:
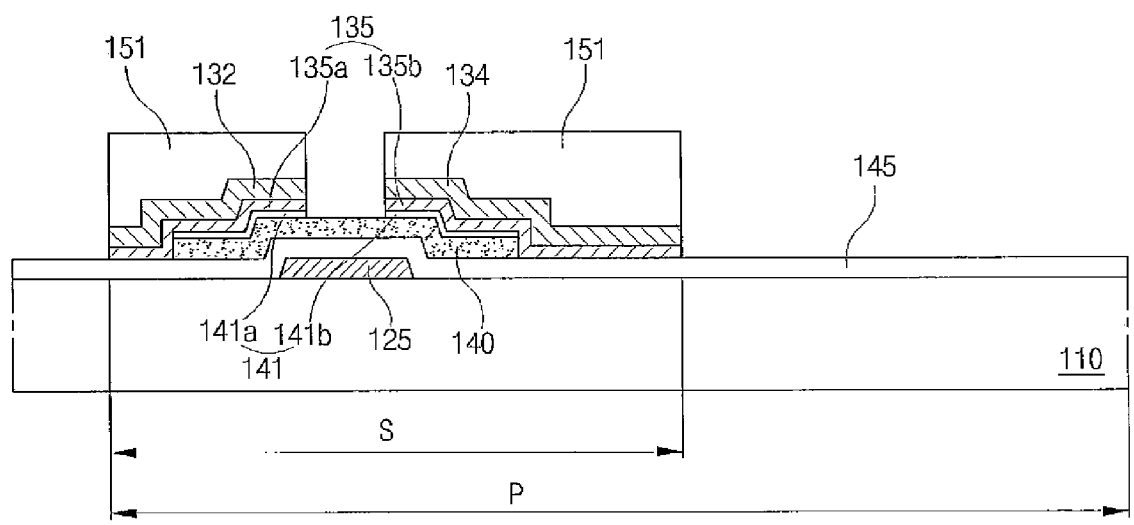

FIGS. 3C to 3E show a third mask process. In FIG. 3C, a second metal layer 128 and a third metal layer 130 are sequentially formed on the substrate 110 including the active layer 140 and the impurity-doped amorphous silicon pattern 142. In this case, the second metal layer 128 includes copper nitride (CuN), while the third metal layer 130 includes pure copper (Cu). The second and third metal layers 128 and 130 arc formed in a same sputtering chamber using a pure Cu target and a nitride gas source. In more detail, when a Cu metallic material begins to be deposited with the pure Cu target, a nitride gas is injected into the sputtering chamber. The process temperature of the sputtering chamber is less than about 350 centigrade. Accordingly, the second metal layer 128 of copper nitride (CuN) is deposited on an entire surface of the substrate 110 including the impurity-doped amorphous silicon pattern 142. After forming the second metal layer 128 with a pre-determined thickness, nitride gas injection is stopped. As a result, the third metal layer 130 of pure Cu is deposited on the second metal layer 128. Because the second and third metal layers 128 and 130 are continuously deposited, it seems that a lower region, where $N_2$ is rich, and an upper region, where $N_2$ is deplete, are continuously laminated. Namely, the diffusion from the pure Cu layer is blocked by the N2 rich layer which is under the pure Cu layer. Since the lower and upper layers are continuously deposited, the fabricating process becomes simple. A thickness of the summation of the CuN layer and the pure Cu layer has a range with about 50 angstroms to 500 angstroms, and the pure Cu layer has a thickness greater than the CuN layer.

Next, a photoresist (PR) layer 150 is formed on the third metal layer 130. And then, a mask M having a transmitting portion A1 and a blocking portion A2 are disposed over the PR layer 150. The transmitting portion A1 has a relatively high transmittance so that light through the transmitting portion can completely change the PR layer 150 chemically. The blocking portion A2 shields light completely. Namely, a transmittance of the transmitting portion A1 is greater than that of the blocking portion A2. The blocking portion A2 corresponds to a portion where the third metal layer 130 should remain. The blocking portion A2 corresponds to both end portions of the gate electrode 125, and the transmitting portion A1 is disposed between the blocking portions A2. Namely, the transmitting portion A1 corresponds to a central portion of the gate electrode 125. Then, the PR layer 150 is exposed through the mask M and developed to form a PR pattern 151, as shown in FIG. 3D.

As shown in FIG. 3D, the PR pattern 151 corresponding to the blocking portion A2 are formed on the third metal layer 130 to correspond to the both end portion of the gate electrode 125, and the PR layer 150 corresponding to the transmitting portion A1 is perfectly removed such that the third metal layer 130 is exposed by the PR pattern 151. Namely, the third metal layer 130 corresponding to the center portion of the gate electrode 125 is exposed.

Next, as shown in FIG. 3E, the exposed third metal layer 130 (of FIG. 3D) and the second metal layer 128 (of FIG. 3D) are wet-etched using the PR pattern 151 as an etching mask to form source and drain electrodes 132 and 134 from the third metal layer 130 (of FIG. 3D) and a barrier pattern 135 including firsts and second sub-barrier patterns 135a and 135b from the second metal layer 128, respectively. At the same time, a data line (not shown), which cross the gate line (not shown) to define the pixel region P and is connected to the source electrode 132, is formed from the third metal layer 130 (of FIG. 3D). The barrier pattern 135 prevents a Cu material in the source and drain electrodes 132 and 134 being diffused into the impurity-doped amorphous silicon pattern 142 from which an ohmic contact layer is formed. Since the second metal layer 128 (of FIG. 3D) and the third metal layer 130 (of FIG. 3D) are etched, the impurity-doped amorphous silicon layer 141 (of FIG. 130) is exposed. Since the second and third metal layer 128 and 130 include a similar or the same kind metal material, the same etchant, for example, phosphoric acid ($H_3PO_4$), nitric acid ($HNO_3$), acetic acid ($CH_3COOH$) and their mixture with water ($H_2O$), may be used for etching them. Accordingly, the fabricating process becomes further simply, and the galvanic corrosion problem in the related art is prevented.

Figure 5:
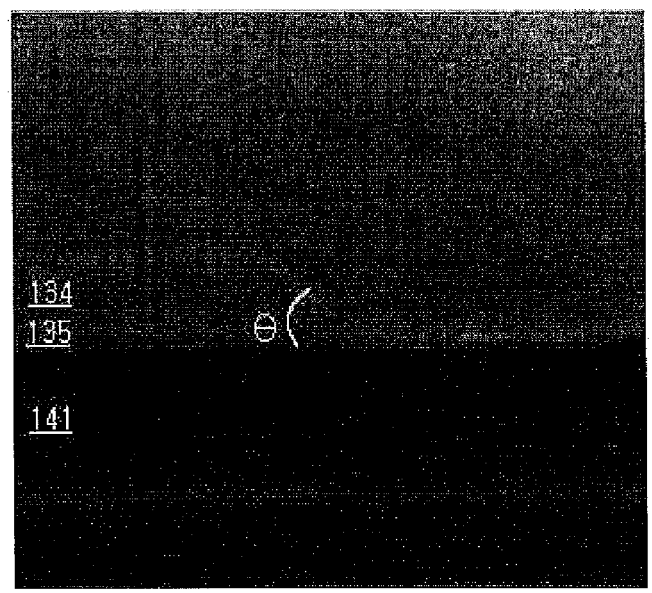
FIG. 5 is a scanning electron microscope (SEM) picture of a portion of a thin film transistor according to the present invention.

Moreover, the second metal layer 128 (of FIG. 3D) of CuN has an etching rate to the above etchant lower than the third metal layer 130 (of FIG. 3D) of pure Cu. Accordingly, after being etched, side portions of the barrier pattern 135 have a taper slope having a taper angle with a range of about 30 degrees to about 60 degrees. Referring to FIG. 5, the taper angle is defined an angle $\theta$ between a top surface of an ohmic contact layer 141 and a side surface of the barrier pattern 135. Accordingly, the barrier pattern 135 has a high adhesive strength to the ohmic contact layer 141.

Referring again to FIG. 3E, an exposed portion of the impurity-doped amorphous silicon 142 is dry-etched to form an ohmic contact layer 141 including first and second ohmic contact patterns 141a and 141b and expose a portion of the active layer 140. The exposed portion of the active layer 140 is exposed through respective pairs of the first and second ohmic contact patterns 141a and 141b, the first and second barrier patterns 135a and 135b, and the source and drain electrodes 132 and 134. The active layer 140 and the ohmic contact layer 141 constitute a semiconductor layer.

Figure 3F:
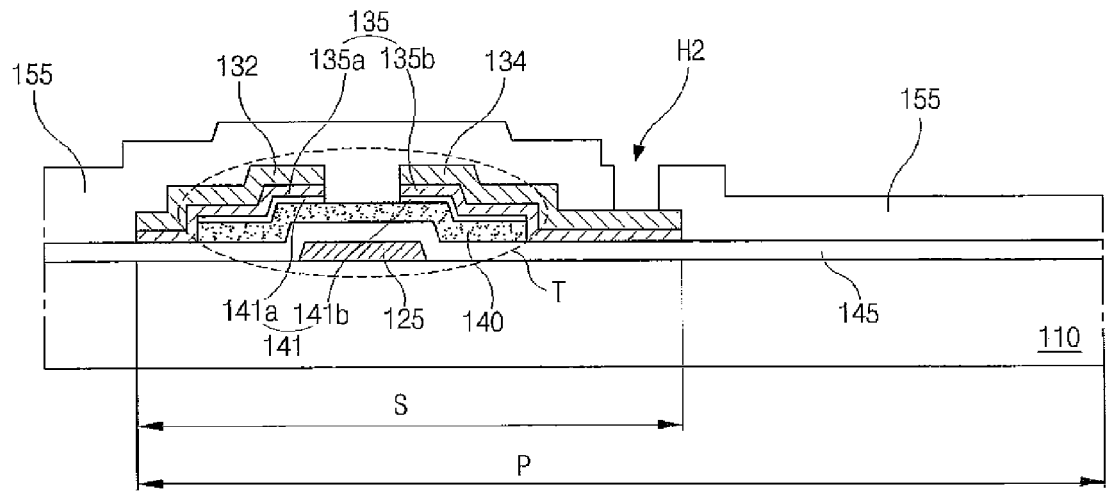

Next, as shown in FIG. 3F, the PR pattern 151 (of FIG. 3E) is removed, and then an inorganic insulating material, such as silicon nitride (SiNx) and silicon oxide (SiO2), is deposited on an entire surface of the substrate 110 including the source and drain electrodes 132 and 134 to form a passivation layer 155. And then, the passivation layer 155 is patterned through a fourth mask process to form a drain contact hole H2 exposing a portion of the drain electrode 134.

Figure 3G:
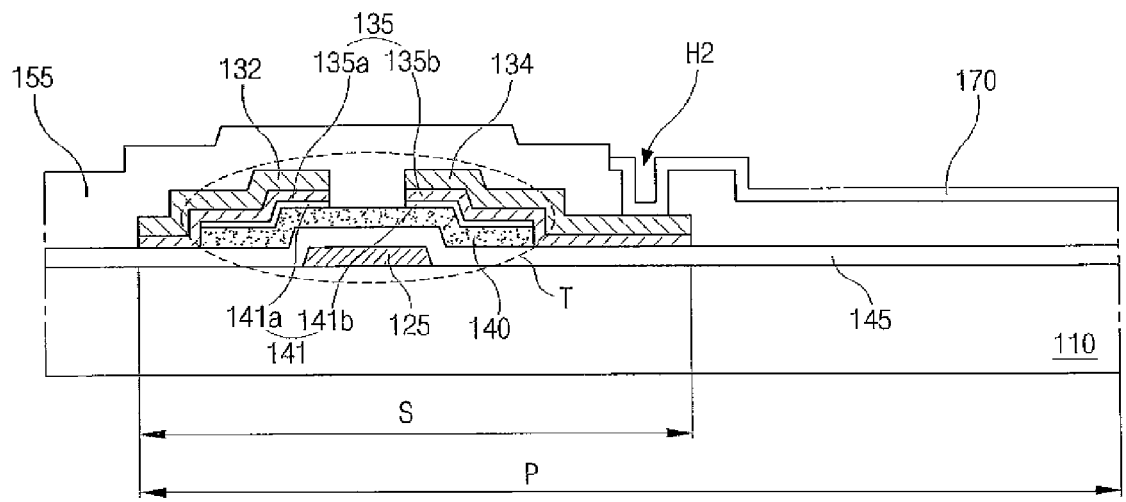

Next, as shown in FIG. 3G, a transparent conductive material, such as indium-tin-oxide (ITO) and indium-zinc-oxide (IZO), is deposited on the passivation layer 155 and patterned through a fifth mask process to form a pixel electrode 170. The pixel electrode 170 is connected to the drain electrode 134 through the drain contact hole H2.

An array substrate for an LCD device is fabricated by the above-mentioned five mask processes.

Another method of fabricating process is explained with FIGS. 4A to 4G. FIGS. 4A to 4G are cross-sectional views showing fabricating processes of a portion of an array substrate for an LCD device including a TFT according to the present invention.

Figure 4A:
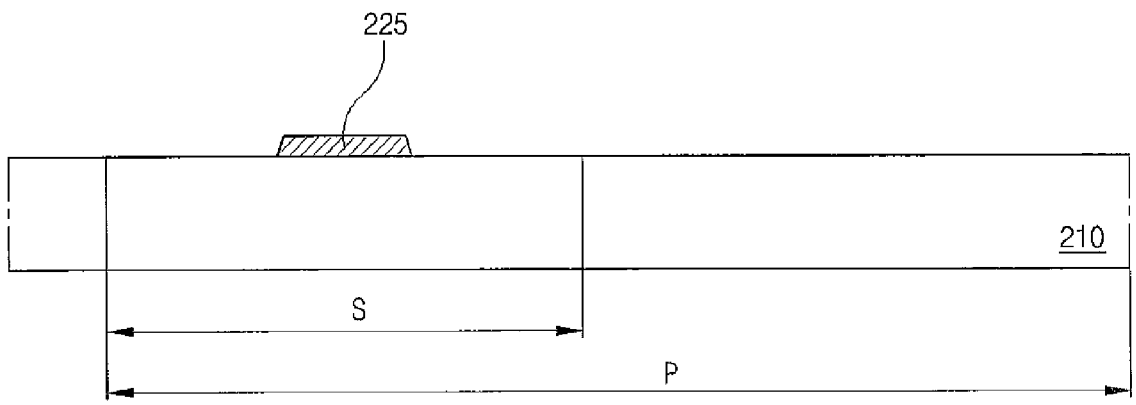
FIGS. 4A to 4G are cross-sectional views showing fabricating processes of a portion of an array substrate for an LCD device including a TFT according to the present invention.

FIG. 4A show a first mask process. In FIG. 4A, a first metal layer (not shown) is formed on the substrate 210 and then patterned through a first mask process to form a gate electrode 225 in the switching region S. At the same time, a gate line (not shown), which is connected to the gate electrode 225, is formed on the substrate 210.

FIGS. 4B to 4E show a second mask process. Different from a fabricating method explained with FIGS. 3A to 3G, the source and drain electrodes, the barrier pattern, the ohmic contact layer and the active layer are formed through a single mask process in this embodiment.

Figure 4B:
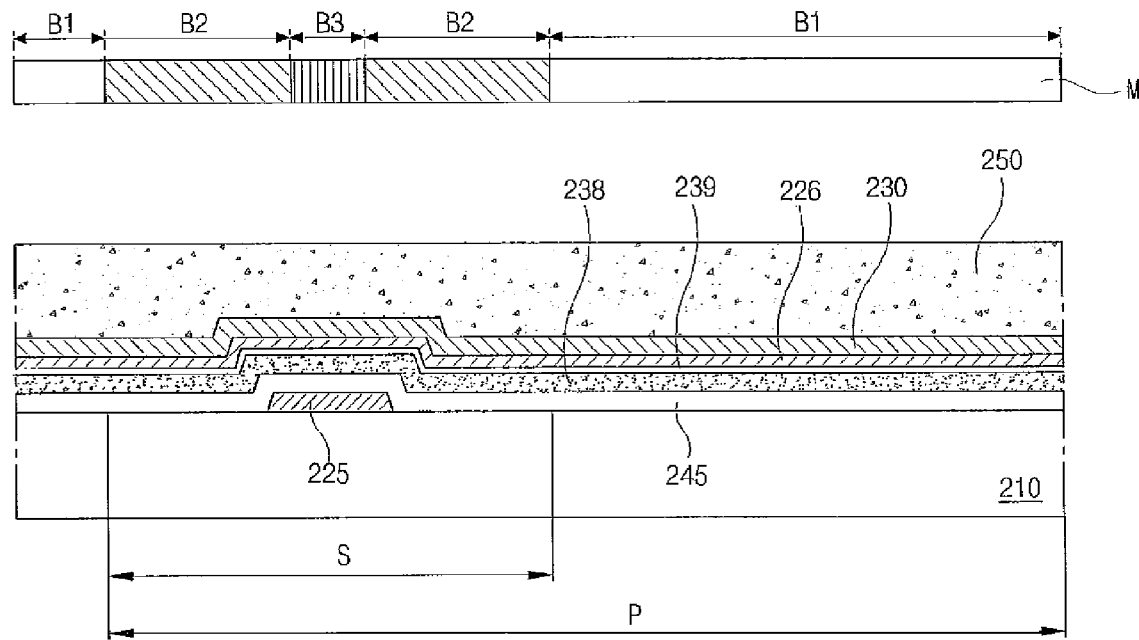

In FIG. 4B, a gate insulating layer 245, an intrinsic amorphous silicon layer 238, an impurity-doped amorphous silicon layer 239, a second metal layer 226, a third metal layer 230, and a PR layer 250 are sequentially formed on an entire surface of the substrate 210 including the gate electrode 225. The gate insulating layer 245 includes an inorganic insulating material, such as silicon nitride (SiNx) and silicon oxide (SiO2). The second metal layer 226 includes copper nitride (CuN), while the third metal layer 130 includes pure copper (Cu).). A thickness of the summation of the CuN layer and the pure Cu layer has a range with about 50 angstroms to 500 angstroms, and the pure Cu layer has a thickness greater than the CuN layer. The second and third metal layers 128 and 130 are formed in a same sputtering chamber using a pure Cu target and a nitride gas source. A detailed depositing method is explained with FIG. 3C.

Figure 4C:
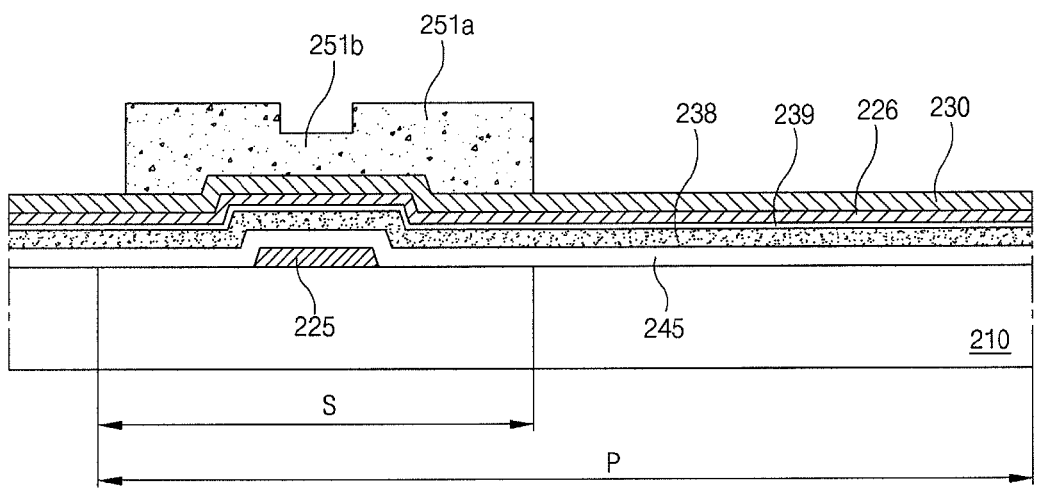

A mask M having a transmitting portion B1, a blocking portion B2 and a half-transmitting portion B3 are disposed over the PR layer 250. The transmitting portion B1 has a relatively high transmittance so that light through the transmitting portion can completely change the PR layer 214 chemically. The blocking portion B2 shields light completely. Namely, a transmittance of the half-transmitting portion B3 is smaller than that of the transmitting portion B1 and is greater than that of the blocking portion B2. The blocking portion B2 corresponds to a portion where the third metal layer 230 should remain. The blocking portion B2 corresponds to both end portions of the gate electrode 225, and the half-transmitting portion B3 is disposed between the blocking portions B2. Namely, the half-transmitting portion B3 corresponds to a central portion of the gate electrode 225. Then, the PR layer 250 is exposed through the mask M and developed to form first and second PR patterns 251a and 251b, as shown in FIG. 4C. The first PR pattern 251a corresponds to the blocking portion B2, and the second PR pattern 251b corresponds to the half-transmitting portion B3. Accordingly, the first and second PR patterns 251a and 251b are disposed on the third metal layer 230 corresponding to the switching region S. The second PR pattern 251b corresponds to the center portion of the gate electrode 225 and has a lower thickness than the first PR pattern 251a. Although not shown, the first PR pattern 251a is also formed to correspond to a portion where the data line is formed. Moreover, since the PR layer 250 (of FIG. 4B)

corresponding to the transmitting portion B1 of the mask M is perfectly removed such that the third metal layer 230 is exposed.

Figure 4D:
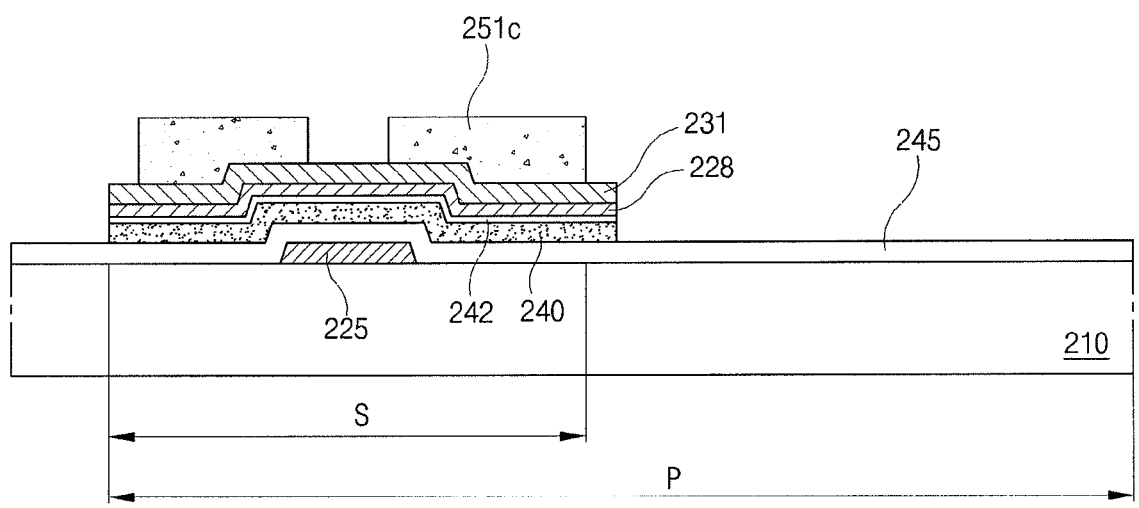

Next, as shown in FIG. 4D, an exposed portion of the third metal layer 230 (of FIG. 4C), the second metal layer 226 (of FIG. 4C), the impurity-doped amorphous silicon layer 239 (of FIG. 4C) and the intrinsic amorphous silicon layer 238 (of FIG. 4C) are etched to form an active layer 240 from the intrinsic amorphous silicon layer 238 (of FIG. 4C), an impurity-doped amorphous silicon pattern 242 from the impurity-doped amorphous silicon layer 239 (of FIG. 4C), a barrier metal layer 228 from the second metal layer 226 (of FIG. 4C), and a source-drain metal layer 231 from the third metal layer 230 (of FIG. 4C). The second metal layer 226 (of FIG. 4C) and the third metal layer 230 (of FIG. 4C) are wet-etched using an etchant, such as phosphoric acid ($H_3PO_4$), nitric acid ($HNO_3$), acetic acid ($CH_3COOH$) and their mixture with water ($H_2O$), respectively, and the impurity-doped amorphous silicon layer 239 (of FIG. 4C) and the intrinsic amorphous silicon layer 238 (of FIG. 4C) are dry-etched. Next, the first PR pattern 251a (of FIG. 4C) is removed by ashing the first and second PR patterns 251a and 251b (of FIG, 4C) such that the source-drain metal layer 231 corresponding to the center portion of the gate electrode 225 is exposed. Moreover, a third PR pattern 251c is formed from the first PR pattern 251a (of FIG. 4C), and both end portions of the source-drain metal layer 231 are exposed.

Figure 4E:
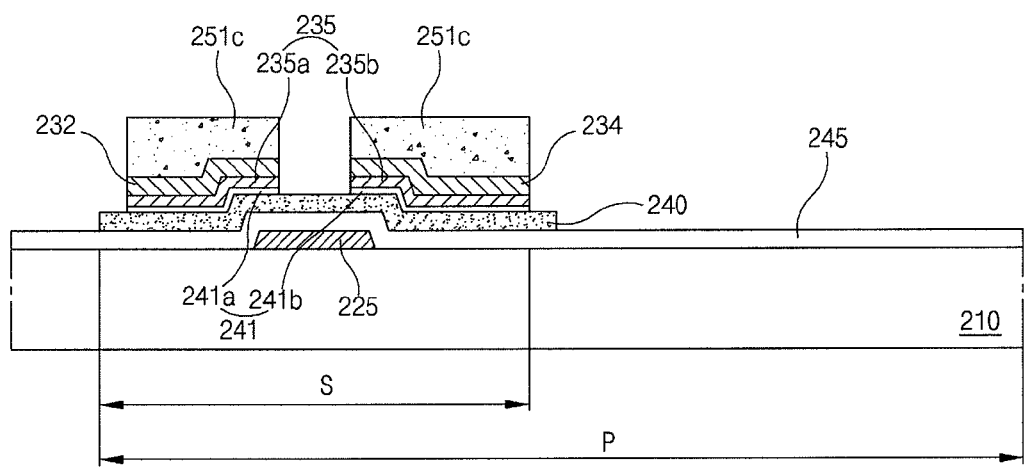

Next, as shown in FIG. 4E, exposed portions of the source-drain metal layer 231 (of FIG. 4D), the barrier metal layer 228 (of FIG. 4D) and the impurity-doped amorphous silicon pattern 242 (of FIG. 4D) are etched to form source and drain electrodes 232 and 234 from the source-drain metal layer 231 (of FIG. 4D), a barrier pattern 235 including first and second sub-barrier patterns 235a and 235b from the barrier metal layer 228 (of FIG. 4D), and an ohmic contact layer 241 including first and second ohmic contact patterns 241a and 241b from the impurity-doped amorphous silicon pattern 242 (of FIG. 4D). The active layer 240 is exposed between the first and second ohmic contact patterns 241a and 241b.

As mentioned above with FIG. 3D, the second and third metal layer 226 and 230 include a similar or the same kind metal material, the same etchant, for example, phosphoric acid ($H_3PO_4$), nitric acid ($HNO_3$), acetic acid ($CH_3COOH$) and their mixture with water ($H_2O$), may be used for etching them. Accordingly, the fabricating process becomes further simply, and the galvanic corrosion problem in the related art is prevented. Moreover, the barrier pattern 235 has a high adhesive strength to the ohmic contact layer 241. The barrier pattern 235 prevents a Cu material in the source and drain electrodes 232 and 234 being diffused into the ohmic contact layer 241.

Next, the third PR pattern 251c is removed.

Figure 4F:
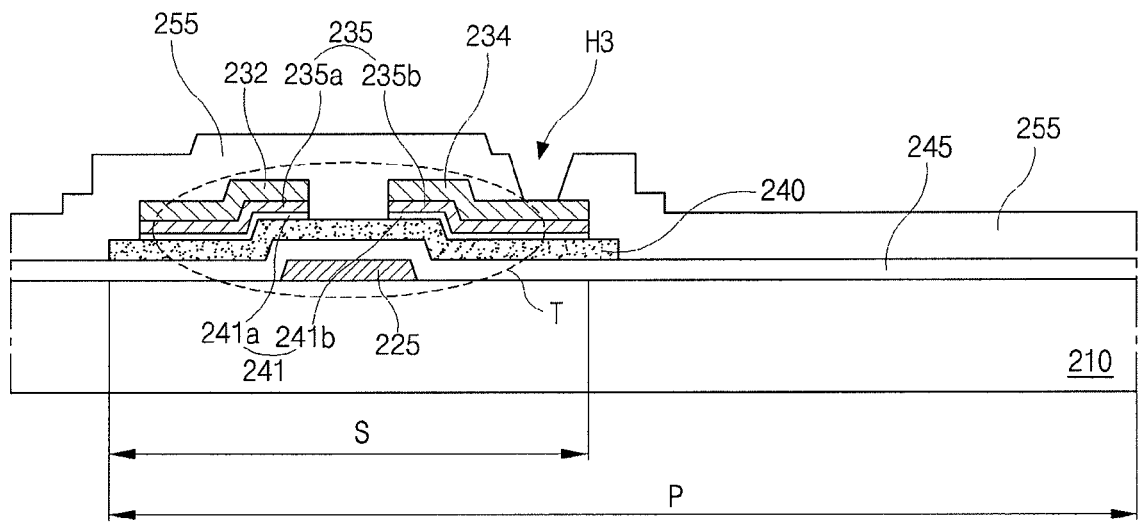

FIG. 4F show a third mask process. As shown in FIG. 4F, an inorganic insulating material, such as silicon nitride (SiNx) and silicon oxide (SiO2), is deposited on an entire surface of the substrate 210 including the source and drain electrodes 232 and 234 to form a passivation layer 255. And then, the passivation layer 255 is patterned through a third mask process to form a drain contact hole H3 exposing a portion of the drain electrode 234.

Figure 4G:
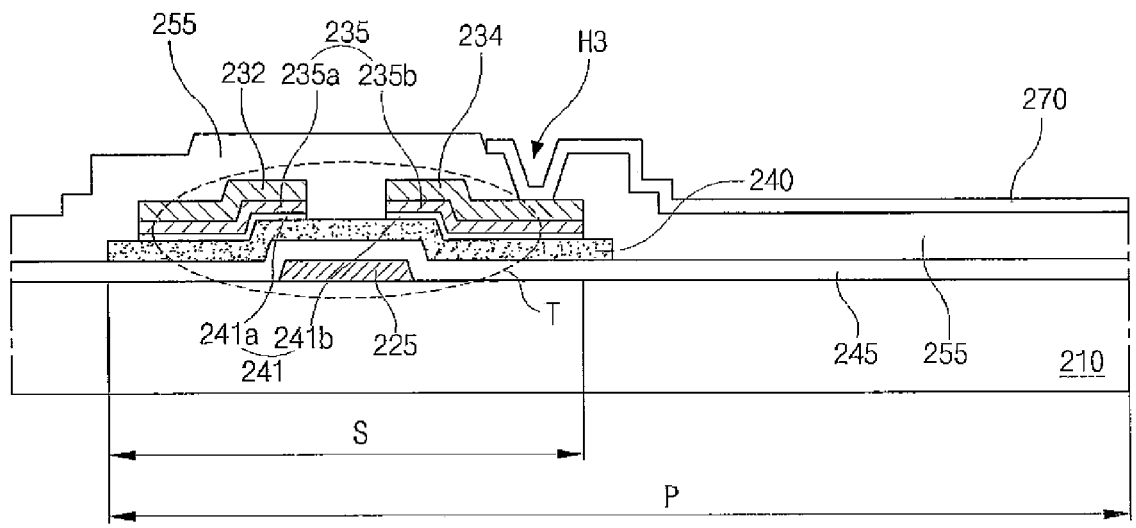

Next, as shown in FIG. 4G, a transparent conductive material, such as indium-tin-oxide (ITO) and indium-zinc-oxide (IZO), is deposited on the passivation layer 255 and patterned through a fifth mask process to form a pixel electrode 270. The pixel electrode 270 is connected to the drain electrode 234 through the drain contact hole H2.

In this embodiment, an array substrate for an LCD device is fabricated by four mask processes.

FIG. 5 is a scanning electron microscope (SEM) picture of a portion of a thin film transistor according to the present invention. As explained above, the taper angle θ between a top surface of an ohmic contact layer 141 and a side surface of the barrier pattern 135. Accordingly, the barrier pattern 135 has a high adhesive strength to the ohmic contact layer 141. Moreover, there is no impurity at an interface between the ohmic contact layer 141 and the barrier pattern 135. The side portions of the barrier pattern 135 have a taper angle θ with a range of about 30 degrees to about 60 degrees.

Figure 6:
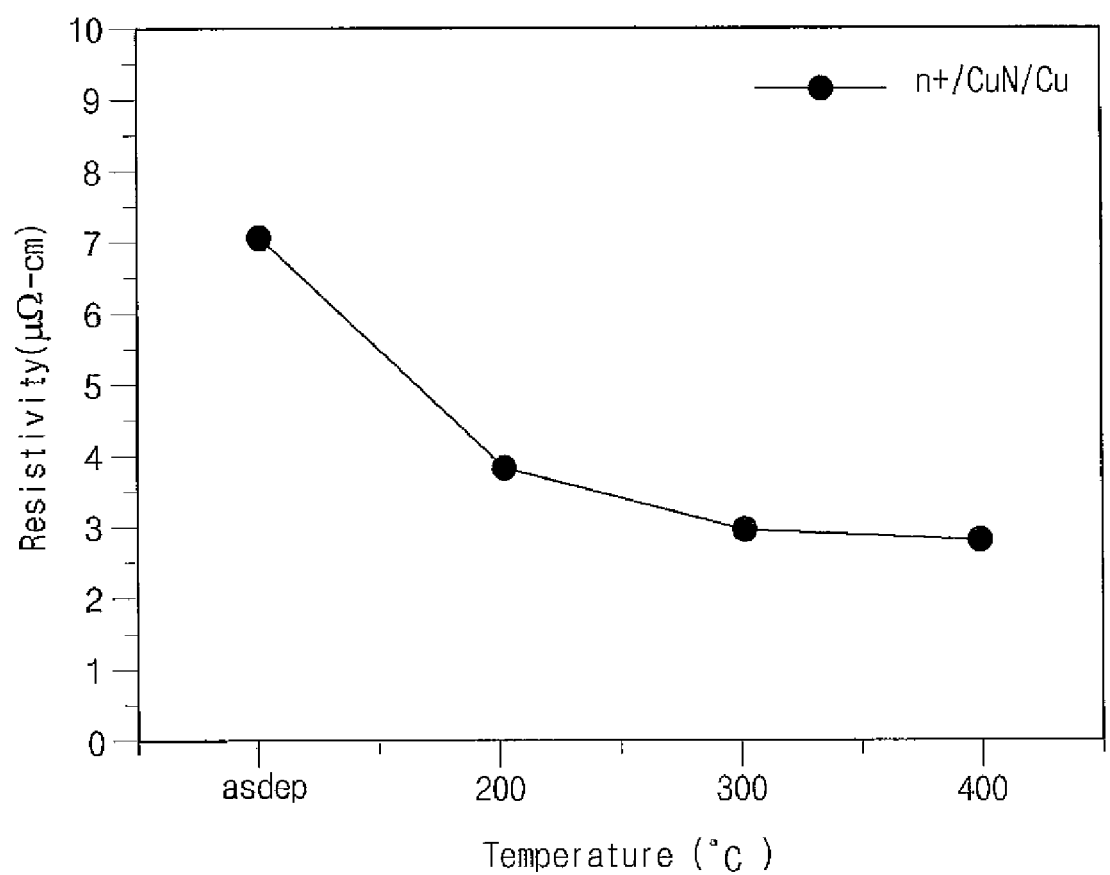
FIG. 6 is a graph showing a specific resistivity of a thin film transistor depending on a temperature.

FIG. 6 is a graph showing a specific resistivity of a thin film transistor depending on a temperature. As shown in FIG. 6, the specific resistivity of triple-layered structure, which includes the ohmic contact layer of impurity-doped amorphous silicon, the barrier pattern of copper nitride and the source and drain electrodes of pure copper, is inverse proportion to a temperature. As the triple-layered structure is deposited before heating, it is defied as "asdep". The layer at asdep has a greatest specific resistivity. Namely, the higher is the temperature, the lower the resistivity is. It means that an ohmic contact property between the ohmic contact layer and each of the source and drain electrodes is improved due to the barrier pattern.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. A method of fabricating a thin film transistor, comprising:

forming a gate electrode on a substrate;

forming a gate insulating layer on the gate electrode;

forming a semiconductor layer on the gate insulating layer, the semiconductor layer corresponding to the gate electrode;

forming first and second barrier patterns on the semiconductor layer, the first and second barrier patterns including copper nitride; and forming source and drain electrodes on the first and second barrier patterns, respectively, the source and drain electrodes including pure copper, wherein each of the source and drain electrodes has a single layer, wherein the step of forming the first and second barrier patterns and the step of forming the source and drain electrodes are performed by a single mask process, wherein the single mask process includes sequentially forming a first metal layer of copper nitride and a second metal layer of pure copper on the semiconductor layer; and patterning the first and second metal layers by a wet-etching process with a single etchant, and wherein the single etchant includes a mixture of phosphoric acid (H3PO4), nitric acid (HNO3), and acetic acid (CH3COOH) with water (H2O) such that ends of each of the first and second barrier patterns has a taper angle of with range of about 30 degrees to about 60 degrees.

2. A method of fabricating an array substrate for a liquid crystal display device, comprising:

forming a gate electrode and a gate line on a substrate, the gate electrode connected to the gate line;

forming a gate insulating layer on the gate electrode and the gate line;

forming a semiconductor layer on the gate insulating layer, the semiconductor layer corresponding to the gate electrode;

forming first and second barrier patterns on the semiconductor layer, the first and second barrier patterns including copper nitride;

forming a data line and source and drain electrodes, the data line crossing the gate line and connected to the source electrode, each of the source and drain electrodes including pure copper, the source and drain electrodes respectively disposed on the first and second barrier patterns; and forming a pixel electrode connected to the drain electrode, wherein each of the source and drain electrodes has a single layer, wherein the step of forming the first and second barrier patterns and the step of forming the data line and the source and drain electrodes are performed by a single mask process, wherein the single mask process comprises:

sequentially forming a first metal layer of copper nitride and a second metal layer of pure copper on the semiconductor layer; and patterning the first and second metal layers by a wet-etching process with a single etchant, and wherein the single etchant includes a mixture of phosphoric acid (H3PO4), nitric acid (HNO3), and acetic acid (CH3COOH) with water (H2O) such that ends of each of the first and second barrier patterns has a taper angle of with range of about 30 degrees to about 60 degrees.

3. The method according to claim 1, wherein the step of sequentially forming the first metal layer and the second metal layer is performed in a sputtering chamber with a pure copper target and a nitrogen gas source.

4. The method according to claim 1, wherein the step of forming the semiconductor layer, the step of forming the first and second barrier patterns and the step of the source and drain electrodes are performed by a single mask process.

5. The method according to claim 3, wherein the nitrogen gas source supplies a nitrogen gas into the sputtering chamber to form the first metal layer, and the nitrogen gas source does not supply the nitrogen gas to form the second metal layer.

6. The method according to claim 3, wherein the sputtering chamber has a processing temperature less than about 350 centigrade.

7. The method according to claim 5, wherein a summation of thicknesses of the first and second metal layers has a range with about 50 angstroms to about 500 angstroms.

8. The method according to claim 5, wherein the second metal layer has a thickness greater than the first metal layer.

9. The method according to claim 2, wherein the step of sequentially forming the first metal layer and the second metal layer is performed in a sputtering chamber with a pure copper target and a nitrogen gas source.

10. The method according to claim 2, wherein the step of forming the semiconductor layer, the step of forming the first and second barrier patterns and the step of the source and drain electrodes are performed by a single mask process.

11. The method according to claim 9, wherein the nitrogen gas source supplies a nitrogen gas into the sputtering chamber to form the first metal layer, and the nitrogen gas source does not supply the nitrogen gas to form the second metal layer.

12. The method according to claim 9, wherein the sputtering chamber has a processing temperature less than about 350 centigrade.

13. The method according to claim 11, wherein a summation of thicknesses of the first and second metal layers has a range with about 50 angstroms to about 500 angstroms.

14. The method according to claim 11, wherein the second metal layer has a thickness greater than the first metal layer.

\* \* \* \* \*